United States Patent
Tu et al.

(10) Patent No.: US 11,800,727 B1
(45) Date of Patent: Oct. 24, 2023

(54) PEROVSKITE SOLAR CELL, ENCAPSULATION METHOD THEREOF, AND PHOTOVOLTAIC ASSEMBLY CONTAINING SAME

(71) Applicant: CONTEMPORARY AMPEREX TECHNOLOGY CO., LIMITED, Ningde (CN)

(72) Inventors: Bao Tu, Ningde (CN); Juanjuan Sun, Ningde (CN); Changsong Chen, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/333,211

(22) Filed: Jun. 12, 2023

Related U.S. Application Data (63) Continuation of application No. PCT/CN2022/074001, filed on Jan. 26, 2022.

(51) Int. Cl.
| | |
|---|---|
| *H01L 51/50* | (2006.01) |
| *H10K 30/50* | (2023.01) |
| *H10K 85/50* | (2023.01) |
| *H10K 30/88* | (2023.01) |
| *H10K 30/81* | (2023.01) |
| *H10K 30/85* | (2023.01) |

(52) U.S. Cl.
CPC ............ *H10K 30/50* (2023.02); *H10K 30/81* (2023.02); *H10K 30/85* (2023.02); *H10K 30/88* (2023.02); *H10K 85/50* (2023.02)

(58) Field of Classification Search
CPC ........ H10K 30/50; H10K 85/50; H10K 30/85; H10K 30/86
See application file for complete search history.

(56) References Cited

U.S. PATENT DOCUMENTS
2019/0206630 A1     7/2019   Choy et al.

FOREIGN PATENT DOCUMENTS
| | | |
|---|---|---|
| CN | 109411611 A | 3/2019 |
| CN | 209515693 U | 10/2019 |
| WO | 2021205336 A1 | 10/2021 |

OTHER PUBLICATIONS

The World Intellectual Property Organization (WIPO) International Search Report for PCT/CN2022/074001 dated Oct. 10, 2022. 8 pages (including English translation).

*Primary Examiner* — Anthony Ho
(74) *Attorney, Agent, or Firm* — ANOVA LAW GROUP, PLLC (57) ABSTRACT

A perovskite solar cell includes following components provided successively from bottom to top: a transparent conductive glass substrate, a first transport layer, a perovskite layer, a second transport layer, a conductive electrode, and a back plate glass. The perovskite solar cell further includes an encapsulating adhesive. The transparent conductive glass substrate, the back plate glass, and the encapsulating adhesive form an enclosed space. The enclosed space contains a mixture of an inert gas and a methylamine gas, where a volume ratio of the inert gas to the methylamine gas is in a range from 9:1 to 5:5.

17 Claims, 1 Drawing Sheet

PEROVSKITE SOLAR CELL, ENCAPSULATION METHOD THEREOF, AND PHOTOVOLTAIC ASSEMBLY CONTAINING SAME

CROSS-REFERENCE TO RELATED APPLICATION

This application is a continuation of International Application No. PCT/CN2022/074001, filed on Jan. 26, 2022, the entire content of which is incorporated herein by reference.

TECHNICAL FIELD

The present application relates to the technical field of solar cells, and in particular to a perovskite solar cell, an encapsulation method thereof, and a photovoltaic assembly containing the same.

BACKGROUND

In recent years, the problems of global energy shortage and environmental pollution have become increasingly prominent, and a solar cell has received more attention as an ideal renewable energy source. A solar cell, also known as a photovoltaic cell, is a device that directly converts light energy into electrical energy by the photoelectric effect or photochemical effect. The perovskite cell is a new type of solar cell widely studied at present, and has rapidly achieved high photoelectric conversion efficiency within a few years after its birth with the highest photoelectric conversion efficiency exceeding 25%, which has a good application prospect. Due to the instability of the perovskite material itself, it is easy to decompose under the influence of light, heat, water, oxygen, etc. The release of an A-site cation gas further accelerates the disintegration of the perovskite structure, resulting in a further decrease in the photoelectric conversion efficiency, and therefore, the stability problem is the biggest obstacle to the industrialization of perovskite cells. Generally, device encapsulation can block the contact of the perovskite material with water and oxygen, especially water vapor and oxygen to some extent, and improve the stability of water and oxygen, but it has little effect on the improvement of thermal stability.

SUMMARY

In view of the foregoing issues, the present application is made with an objective to provide a perovskite solar cell having good thermal stability, an encapsulation method thereof, and a photovoltaic assembly containing the same.

In a first aspect of the present application, a perovskite solar cell is provided, including the following components provided successively from bottom to top:
  a transparent conductive glass substrate;
  a first transport layer;
  a perovskite layer;
  a second transport layer;
  a conductive electrode;
  a back plate glass; and
  an encapsulating adhesive;
  where an enclosed space is formed between the transparent conductive glass substrate and the back plate glass under the action of the encapsulating adhesive, and the enclosed space contains a mixture of an inert gas and a methylamine gas, where a volume ratio of the inert gas to the methylamine gas is 9:1 to 5:5, optionally 9:1 to 6:4, more optionally 8:2 to 7:3.

A structure of a perovskite solar cell in the present application can not only effectively block the contact of a perovskite material with water and oxygen, especially water vapor and oxygen, but also prevent the decomposition of the perovskite layer to generate a methylamine gas, thereby improving the stability and safety of the perovskite solar cell.

In any embodiment, optionally, an absolute pressure within the enclosed space is 2-6 standard atmospheres. The pressure within the enclosed space is within the foregoing range, which helps to form a stable encapsulation structure.

In any embodiment, optionally, an area of the perovskite layer is consistent with an area of the enclosed space, and a ratio of a thickness of the perovskite layer to a height of the enclosed space is 1/5000-1/500, optionally 1/2000-1/750.

In any embodiment, optionally, the inert gas is selected from at least one of nitrogen and argon.

In any embodiment, optionally, the perovskite layer includes a compound of formula $A^1BX_3$ or $A^2CDX_6$,
  $A^1$ is selected from at least one of $CH_3NH_3^+(MA^+)$ or $CH(NH_2)_2^+(FA^+)$;
  $A^2$ is selected from at least one of $Li^+$, $Na^+$, $K^+$, $Rb^+$, and $Cs^+$;
  B is selected from at least one of $Pb^{2+}$, $Sn^{2+}$, $Be^{2+}$, $Mg^{2+}$, $Ca^{2+}$, $Sr^{2+}$, $Ba^{2+}$, $Zn^{2+}$, $Ge^{2+}$, $Fe^{2+}$, $Co^{2+}$, and $Ni^{2+}$, optionally at least one of $Pb^{2+}$ or $Sn^{2+}$;
  X is selected from at least one of $F^-$, $Cl^-$, $Br^-$, and $I^-$, and may be at least one of $Cl^-$, $Br^-$, and $I^-$; and
  C and D are independently selected from an organic or inorganic cation, or an organic-inorganic mixed cation, optionally a transition metal cation, or a mixed cation of a transition metal cation with $CH_3NH_3^+$ or $CH(NH_2)_2^+$, more optionally at least one of $Pb(FA_{0.83}MA_{0.17})^{3+}$, $CH_3NH_3Pb^{3+}$, $Pb^{2+}$, $Sr^{2+}$, $Bi^{3+}$, and $La^{3+}$.

In any embodiment, optionally, the perovskite layer includes at least one of $CH_3NH_3PbI_3$, $CH(NH_2)_2PbI_3$, $Cs_{0.05}(FA_{0.83}MA_{0.17})_{0.95}Pb(I_{0.83}Br_{0.17})_3$, $CsPbI_3$, $CsPbI_2Br$, or $CsPbIBr_2$.

In any embodiment, optionally, the encapsulating adhesive is selected from one or more of an epoxy-based encapsulating adhesive, a silicone-based encapsulating adhesive, a polyurethane encapsulating adhesive, an ethylene-vinyl acetate copolymer, polyvinyl butyral, and a polyolefin-based encapsulating adhesive.

In any embodiment, optionally, the polyolefin-based encapsulating adhesive is selected from one or more of an ethylene octene copolymer and polyisobutylene.

In any embodiment, optionally, the encapsulating adhesive is selected from an ultraviolet light curing encapsulating adhesive.

In any embodiment, optionally, the transparent conductive glass substrate (101) includes one or more of fluorine-doped tin dioxide (FTO), indium-doped tin oxide (ITO), aluminium-doped zinc oxide (AZO), boron-doped zinc oxide (BZO), and indium-doped zinc oxide (IZO).

In any embodiment, optionally, the first transport layer is an electron transport layer and the second transport layer is a hole transport layer; or the first transport layer is a hole transport layer and the second transport layer is an electron transport layer.

In any embodiment, optionally, the electron transport layer includes at least one of the following materials, derivatives thereof, or materials obtained by doping or passivation thereof: [6,6]-phenyl $C_{61}$ butyric acid methyl ester ($PC_{61}BM$), [6,6]-phenyl $C_{71}$ butyric acid methyl ester (PC$_{71}$BM), fullerene C60 (C60), fullerene C70 (C70), tin dioxide (SnO$_2$), and zinc oxide (ZnO).

In any embodiment, optionally, the hole transport layer includes at least one of the following materials, their derivatives, or materials obtained by doping or passivation thereof: poly[bis(4-phenyl)(2,4,6-trimethylphenyl)amine] (PTAA), poly-3-hexylthiophene (P3HT), triphenylamine with triptycene as a core (H101), 3,4-ethylenedioxythiophene-methoxytriphenylamine (EDOT-OMeTPA), N-(4-aniline) carbazole-spirobifluorene (CzPAF-SBF), poly(3,4-ethylenedioxythiophene): poly(styrene sulfonate) (PEDOT: PSS), polythiophene, nickel oxide (NiO$_x$), molybdenum oxide (MoO$_3$), cuprous iodide (CuI), cuprous oxide (Cu$_2$O).

In any embodiment, optionally, the conductive electrode includes at least one of the following materials: Ag, Cu, C, Au, Al, indium-doped tin oxide (ITO), aluminum-doped zinc oxide (AZO), boron-doped zinc oxide (BZO), and indium-doped zinc oxide (IZO).

In any embodiment, optionally, a thickness of the perovskite layer is 300-1000 nm.

In a second aspect of the present application, an encapsulation method of a perovskite solar cell is provided, at least including the following steps:

step 1: providing a perovskite solar cell assembly, which at least including a transparent conductive glass substrate, a back plate glass, and a perovskite layer located therebetween; and step 2: forming an enclosed space between the transparent conductive glass substrate and the back plate glass under the action of an encapsulating adhesive, the enclosed space containing a mixture of an inert gas and a methylamine gas with a volume ratio of 9:1 to 5:5, optionally 9:1 to 6:4, more optionally 8:2 to 7:3.

In a third aspect of the present application, a photovoltaic assembly is provided, including the perovskite solar cell in the first aspect of the present application.

The photovoltaic assembly of the present application includes the perovskite solar cell in the first aspect of the present application, and thus has the same advantages as the perovskite solar cell in the present application.

DESCRIPTION OF REFERENCE SIGNS

101 transparent conductive glass substrate; 102 first transport layer; 103 perovskite layer; 104 second transport layer; 105 conductive electrode; 106 back plate glass; 107 encapsulating adhesive; and 108 enclosed space Description of Embodiments Hereinafter, embodiments that specifically disclose a perovskite cell and an encapsulation method thereof of the present application will be described in detail with reference to the accompanying drawings as appropriate. However, unnecessarily detailed descriptions may be omitted in some cases. For example, detailed descriptions of well-known matters and repeated descriptions of practically identical structures are omitted. This is done to avoid unnecessary redundant descriptions for ease of understanding by persons skilled in the art. In addition, the drawings and the following description are provided for a full understanding of the present application by persons skilled in the art, and are not intended to limit the subject matter in the claims.

A "range" disclosed herein is defined in the form of a lower limit and an upper limit. A given range is defined by selecting a lower limit and an upper limit, and the selected lower limit and upper limit define a boundary of a particular range. The range defined in this manner may or may not include end values, and may be combined arbitrarily, that is, any lower limit may be combined with any upper limit to form a range. For example, if ranges of 60-120 and 80-110 are listed for a particular parameter, it is understood that ranges of 60-110 and 80-120 are also contemplated. In addition, if the minimum range values listed are 1 and 2, and the maximum range values listed are 3, 4 and 5, all the following ranges are contemplated: 1-3, 1-4, 1-5, 2-3, 2-4, and 2-5. In the present application, unless otherwise specified, a numerical range "a-b" represents an abbreviated representation of any combination of real numbers between a and b, where both a and b are real numbers. For example, a numerical range "0-5" means that all real numbers between "0-5" have been listed herein, and "0-5" is just an abbreviated representation of a combination of these numerical values. In addition, when a certain parameter is expressed as an integer ≥2, it is equivalent to disclosing that the parameter is, for example, an integer of 2, 3, 4, 5, 6, 7, 8, 9, 10, 11, 12, or the like.

Unless otherwise specified, all embodiments and optional embodiments of the present application may be combined with each other to form a new technical solution.

Unless otherwise specified, all technical features and optional technical features of the present application may be combined with each other to form a new technical solution.

Unless otherwise specified, all steps of the present application may be performed sequentially or randomly, and in some embodiments, performed sequentially. For example, a method includes steps (a) and (b), which means that the method may include steps (a) and (b) performed sequentially, or steps (b) and (a) performed sequentially. For example, the method mentioned may further include step (c), which means that step (c) may be added to the method in any order, for example, the method may include steps (a), (b) and (c), steps (a), (c) and (b), steps (c), (a) and (b), or the like.

Unless otherwise specified, "comprising" and "containing" mentioned in the present application are open-ended. For example, the "comprising" and "containing" may mean that other components that are not listed may further be comprised or contained.

In the present application, unless otherwise specified, the term "or" is inclusive. For example, the phrase "A or B" means "A, B or both A and B". More particularly, a condition "A or B" is satisfied by any one of the following: A is true (or present) and B is false (or not present); A is false (or not present) and B is true (or present); or both A and B are true (or present). In this disclosure, the phrases "at least one of A, B, and C" and "at least one of A, B, or C" both mean only A, only B, only C, or any combination of A, B, and C.

It should be noted that the term "consistent area" used in the present application means that projected areas of two objects in a certain direction are approximately equal with a difference not exceeding ±5%. For example, in the present application, that "an area of the perovskite layer is consistent with an area of the enclosed space" means that projected areas of the perovskite layer and the enclosed space in a thickness direction of the perovskite layer are approximately equal with a difference not exceeding±5%.

In practical work, the inventor found that the perovskite solar cell is encapsulated by a mixture of the inert gas and the methylamine gas, which can effectively alleviate the phenomenon of yellowing of the device and haze effect of the electrode. By adjusting and controlling the pressure of the mixture and the volume ratio of the inert gas to the methylamine gas, the thermal stability of the solar cell can be further improved, and the photoelectric conversion efficiency can be improved. Without wishing to be bound by any theory, the reason for the above phenomenon may be the decomposition of the perovskite during storage, which causes the methylamine gas to escape from the light absorbing layer, lead iodide to be left, and the like.

After further research, it is found that the perovskite solar cell in the present application can be applied in various scenarios like the conventional perovskite cell, such as a power station, a photovoltaic building, a photovoltaic electronic device, and the like.

[Perovskite Solar Cell]

In a first aspect of the present application, a perovskite solar cell is provided, including the following components provided successively from bottom to top:

a transparent conductive glass substrate;
a first transport layer;
a perovskite layer;
a second transport layer;
a conductive electrode;
a back plate glass; and an encapsulating adhesive;
where an enclosed space is formed between the transparent conductive glass substrate and the back plate glass under the action of the encapsulating adhesive, and the enclosed space contains a mixture of an inert gas and a methylamine gas, where a volume ratio of the inert gas to the methylamine gas is 9:1 to 5:5, optionally 9:1 to 6:4, more optionally 8:2 to 7:3.

Due to the instability of a perovskite material itself, the perovskite solar cell is prone to decomposition under the influence of light, heat, water, oxygen, etc., resulting in a decrease in photoelectric conversion efficiency. The perovskite solar cell in the present application contains an inert gas and a methylamine gas that are added from the outside, which can not only effectively block the contact of the perovskite material with water and oxygen, especially water vapor and oxygen, but also effectively inhibit the escape of methylamine gas generated by the decomposition of perovskite under the condition of a concentration difference or a positive pressure, thereby improving the stability of the encapsulation structure. In addition, the methylamine gas is flammable, and therefore selecting an appropriate amount of the methylamine gas can further improve safety performance.

Figure 1:
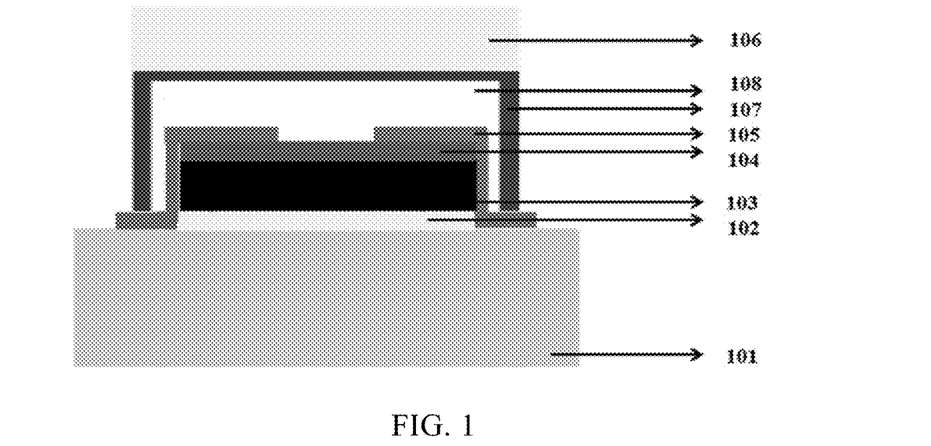
FIG. 1 is a schematic diagram of a structure of a gas-assisted encapsulated perovskite solar cell.

FIG. 1 shows an example structure of a perovskite solar cell of the present application. Referring to FIG. 1, a first transport layer (102) is disposed on an upper part of a transparent conductive glass substrate (101), a perovskite layer (103) is closely attached to an upper part of the first transport layer (102), and a second transport layer (104) is closely attached to an upper part of the perovskite layer (103), a conductive electrode (105) is located on the upper part of the second transport layer; peripheral edges of the transparent conductive glass substrate (101) and the back glass (106) are sealed with an encapsulating adhesive (107), and the perovskite layer (103) is encapsulated within an enclosed space (108) formed by the transparent conductive glass substrate (101), the back plate glass (106), and the encapsulating adhesive (107), where the enclosed space (108) is filled with a mixture of an inert gas and a methylamine gas.

Figure 2:
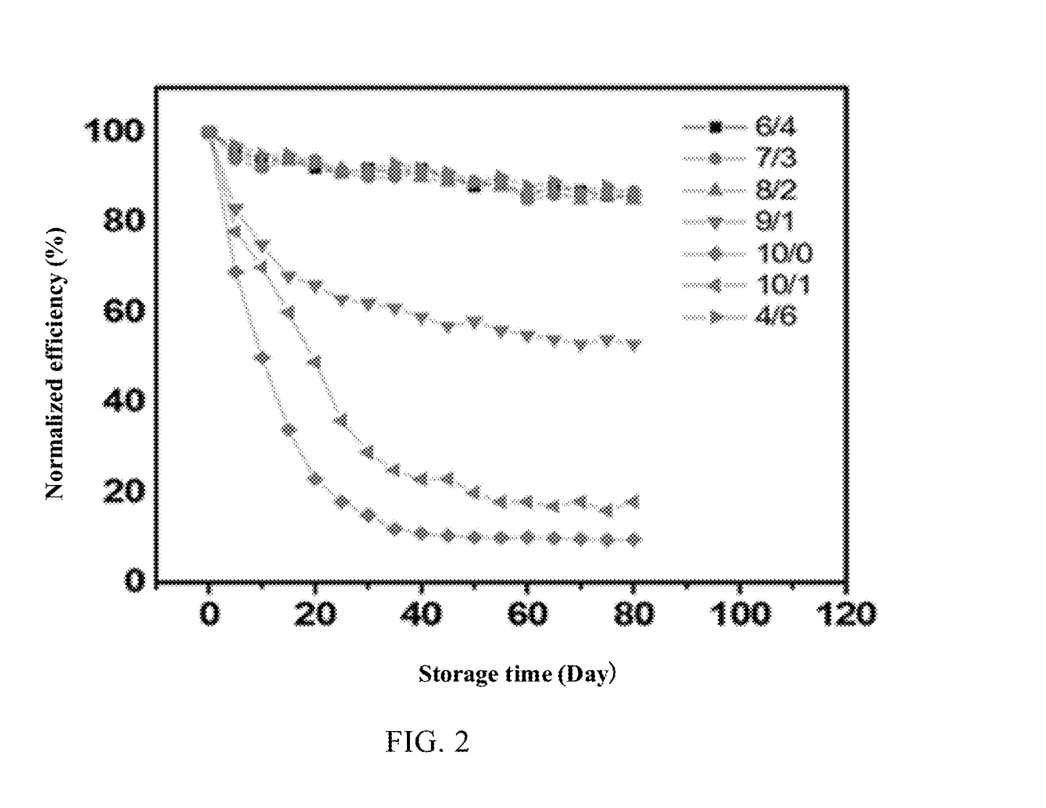
FIG. 2 is a graph of photoelectric conversion efficiency (after normalization) for perovskite solar cells obtained in Comparative Examples and Examples of the present application varying as storage time (days).

After further research, the inventor found that the stability of the perovskite solar cell can be further improved by optimizing the volume ratio of the inert gas to the methylamine gas within the enclosed space. As shown in FIG. 2, when a volume ratio of an argon gas to a methylamine gas is 10:1, the stability of the device is not significantly improved, which is almost comparable to that of the device without the addition of methylamine gas. As the volume ratio of the argon gas to the methylamine gas increases from 9:1 to 8:2, the normalized efficiency of the perovskite solar cell further decreases with time, indicating that the stability of the cells is improved. However, as the volume ratio of the argon gas to the methylamine gas continues to increase, for example, when it is greater than 8:2, the normalized efficiency does not change much, indicating that the stability of the cell does not change significantly. This is mainly because the amount of methylamine gas generated by the decomposition of perovskite in the perovskite solar cell is certain, and when the volume proportion of methylamine gas reaches 20%, the escape of methylamine gas in the perovskite solar cell can be effectively inhibited, and there is no need to further add the methylamine gas. Finally, in Comparative Example 3, it can be found that when the proportion of the methylamine gas is further increased and the volume ratio of the argon gas to the methylamine gas is 4:6, the stability is significantly improved, but by tracing the raw data, it can be found that the initial efficiency of the device has significantly decreased.

In the present application, a solar cell component can be prepared by a method commonly used in the art, such as sputtering, spin coating and the like.

In some embodiments, optionally, an absolute pressure within the enclosed space is 2-6 standard atmospheres.

The absolute pressure within the enclosed space is kept at 2-6 standard atmospheres, which can effectively prevent the infiltration of external gases and block the contact of the perovskite layer with water or oxygen, thereby improving the water and oxygen stability of the perovskite solar cell. Meanwhile, the absolute pressure within the enclosed space is kept within the above range, which can avoid internal cracking or the case where bonding force provided by the encapsulating adhesive is insufficient to form the enclosed space, due to excessive pressure within the enclosed space, thereby ensuring the stability of the encapsulation structure.

It should be noted that despite the inhibitory effect of the added inert gas and methylamine gas, the perovskite layer still decomposes to a certain extent during the use of the perovskite solar cell, generating the methylamine gas. However, the amount of methylamine gas added in the enclosed space is far more than the amount of methylamine gas generated by the decomposition of the perovskite, and therefore, after a period of use, the volume ratio of the inert gas to the methylamine gas within the enclosed space or the pressure within the enclosed space does not change significantly.

In some embodiments, optionally, an area of the perovskite layer is consistent with an area of the enclosed space, and a ratio of a thickness of the perovskite layer to a height of the enclosed space is 1/5000-1/500, optionally 1/2000-1/750.

In some embodiments, optionally, the inert gas is selected from at least one of nitrogen and argon. The inert gas ensures that the perovskite layer does not comes into contact with oxygen, thereby reducing the possibility of decomposition of the perovskite layer.

In the present application, there is no particular limitation on the composition of the perovskite layer, and a perovskite material commonly used in the art can be used. In some embodiments, optionally, the perovskite layer includes a compound of formula $A^1BX_3$ or $A^2CDX_6$, $A^1$ is selected from at least one of $CH_3NH_3^+(MA^+)$ or $CH(NH_2)_2^+(FA^+)$;

$A^2$ is selected from at least one of $Li^+$, $Na^+$, $K^+$, $Rb^+$, and $Cs^+$;

B is selected from at least one of $Pb^{2+}$, $Sn^{2+}$, $Be^{2+}$, $Mg^{2+}$, $Ca^{2+}$, $Sr^{2+}$, $Ba^{2+}$, $Zn^{2+}$, $Ge^{2+}$, $Fe^{2+}$, $Co^{2+}$, and $Ni^{2+}$, optionally at least one of $Pb^{2+}$ or $Sn^{2+}$;

X is selected from at least one of $F^-$, $Cl^-$, $Br^-$, and $I^-$, and may be at least one of $Cl^-$, $Br^-$, and $I^-$; and C and D are independently selected from an organic or inorganic cation, or an organic-inorganic mixed cation, optionally a transition metal cation, or a mixed cation of a transition metal cation with $CH_3NH_3^+$ or $CH(NH_2)_2^+$, more optionally at least one of $Pb(FA_{0.83}MA_{0.17})^{3+}$, $CH_3NH_3Pb^{3+}$, $Pb^{2+}$, $Sr^{2+}$, $Bi^{3+}$, and $La^{3+}$.

In some embodiments, optionally, the perovskite layer includes at least one of $CH_3NH_3PbI_3$, $CH(NH_2)_2PbI_3$, $Cs_{0.05}(FA_{0.83}MA_{0.17})_{0.95}Pb(I_{0.83}Br_{0.17})_3$, $CsPbI_3$, $CsPbI_2Br$, or $CsPbIBr_2$.

In the present application, there is no particular limitation on the selected material of the encapsulating adhesive, and an encapsulating adhesive commonly used in the art can be used. Optionally, the encapsulating adhesive has good adhesiveness, which is sufficient to provide the adhesive force needed to form an enclosed space.

In some embodiments, optionally, the encapsulating adhesive is selected from one or more of an epoxy-based encapsulating adhesive, a silicone-based encapsulating adhesive, a polyurethane encapsulating adhesive, an ethylene-vinyl acetate copolymer, polyvinyl butyral, and a polyolefin-based encapsulating adhesive.

In some embodiments, optionally, the polyolefin-based encapsulating adhesive is selected from one or more of an ethylene octene copolymer and polyisobutylene.

In some embodiments, optionally, the encapsulating adhesive is selected from an ultraviolet light curing encapsulating adhesive.

There is no particular limitation on the selected material of the transparent conductive glass substrate in the present application, and a transparent conductive glass substrate commonly used in the art can be used. In some embodiments, optionally, the transparent conductive glass substrate (101) includes one or more of fluorine-doped tin dioxide (FTO), indium-doped tin oxide (ITO), aluminium-doped zinc oxide (AZO), boron-doped zinc oxide (BZO), and indium-doped zinc oxide (IZO).

In some embodiments, optionally, the first transport layer is an electron transport layer and the second transport layer is a hole transport layer; or the first transport layer is a hole transport layer and the second transport layer is an electron transport layer.

In some embodiments, optionally, the electron transport layer includes at least one of the following materials, derivatives thereof, or materials obtained by doping or passivation thereof: [6,6]-phenyl $C_{61}$ butyric acid methyl ester ($PC_{61}BM$), [6,6]-phenyl $C_{71}$ butyric acid methyl ester ($PC_{71}BM$), fullerene C60 (C60), fullerene C70 (C70), tin dioxide ($SnO_2$), and zinc oxide (ZnO).

In some embodiments, optionally, the hole transport layer includes at least one of the following materials, their derivatives, or materials obtained by doping or passivation thereof: poly[bis(4-phenyl)(2,4,6-trimethylphenyl)amine] (PTAA), poly-3-hexylthiophene (P3HT), triphenylamine with triptycene as a core (H101), 3,4-ethylenedioxythiophene-methoxytriphenylamine (EDOT-OMeTPA), N-(4-aniline) carbazole-spirobifluorene (CzPAF-SBF), poly(3,4-ethylenedioxythiophene):poly(styrene sulfonate) (PEDOT:PSS), polythiophene, nickel oxide ($NiO_x$), molybdenum oxide ($MoO_3$), cuprous iodide (CuI), cuprous oxide ($Cu_2O$).

In some embodiments, optionally, the conductive electrode (105) includes at least one of the following materials: Ag, Cu, C, Au, Al, indium-doped tin oxide (ITO), aluminum-doped zinc oxide (AZO), boron-doped zinc oxide (BZO), and indium-doped zinc oxide (IZO).

In some embodiments, optionally, a thickness of the perovskite layer is 300-1000 nm.

In some embodiments, optionally, a bandgap of the perovskite layer is 1.20-2.30 eV. The band gap of the perovskite layer can be measured by a method commonly used in the art, for example, an ultraviolet absorption curve may be obtained by an ultraviolet absorption spectrum test and then it can be calculated by the Tauc equation.

[Encapsulation Method]

In a second aspect of the present application, an encapsulation method of a perovskite solar cell is provided, at least including the following steps:

step 1: providing a perovskite solar cell assembly, which at least including a transparent conductive glass substrate, a back plate glass, and a perovskite layer located therebetween; and step 2: forming an enclosed space between the transparent conductive glass substrate and the back plate glass under the action of an encapsulating adhesive, the enclosed space containing a mixture of an inert gas and a methylamine gas with a volume ratio of 9:1 to 5:5, optionally 9:1 to 6:4, more optionally 8:2 to 7:3.

In some embodiments, the encapsulation method of the present application is carried out in an encapsulation container such as a glove box or other enclosed pressure devices under an standard atmosphere of a mixture of an inert gas and a methylamine gas. The pressure within the enclosed pressure device may be adjusted by the method commonly used in the art, for example, by adjusting a feed pressure and a flow rate of the inert gas and the methylamine gas.

It can be understood by a person skilled in the art that in addition to the transparent conductive glass substrate, the back plate glass, and the perovskite layer, the perovskite solar cell assembly generally also includes an assembly such as an electron transport layer, a hole transport layer, and a conductive electrode.

[Photovoltaic Assembly]

Perovskite solar cells have a very wide range of applications in many fields such as a power station, a photovoltaic building, and a photovoltaic electronic device. It should be understood that the examples provided in the present application are only used to illustrate the usage of the perovskite solar cell of the present application, and a person skilled in the art can understand that the usage is not limited to the usage provided in the examples.

In a third aspect of the present application, a photovoltaic assembly is provided, including the perovskite solar cell in the first aspect of the present application.

EXAMPLES

Hereinafter, examples of the present application will be described. The examples described below are illustrative, only used to explain the present application, and should not be construed as a limitation to the present application. Where specific techniques or conditions are not specified in the examples, they are performed according to techniques or conditions described in the literature in the art or according to product specifications. The reagents or instruments used without specifying the manufacturer are conventional products that can be obtained from the market.

The sources of raw materials used in Examples are shown in the table as below:

| Name | CAS | Manufacturer |
| --- | --- | --- |
| poly[bis(4-phenyl)(2,4,6-trimethylphenyl)amine] | 1333317-99-9 | Xi'an Polymer Light Technology Corp. |
| [6,6]-phenyl C61 butyric acid methyl ester | 160848-22-6 | Xi'an Polymer Light Technology Corp. |
| bathocuproine | 4733-39-5 | Xi'an Polymer Light Technology Corp. |
| lead iodide | 10101-63-0 | Xi'an Polymer Light Technology Corp. |
| formamidine hydroiodide | 879643-71-7 | Xi'an Polymer Light Technology Corp. |
| methylamine hydrobromide | 6876-37-5 | Xi'an Polymer Light Technology Corp. |
| cesium iodide | 7789-17-5 | Xi'an Polymer Light Technology Corp. |
| lead bromide | 10031-22-8 | Xi'an Polymer Light Technology Corp. |
| chlorobenzene | 108-90-7 | Sigma |
| N,N-dimethylformamide | 68-12-2 | Sigma |
| dimethyl sulfoxide | 67-68-5 | Sigma |
| isopropanol | 67-63-0 | Sigma |

Example 1

1) 20 pieces (for repeated experiments) of ITO conductive glass substrates with a specification of 2.0×2.0 cm (a total thickness of the conductive glass was 1.1 mm, of which a thickness of ITO was about 100 nm) were taken, and the ITOs with a width of 0.35 cm and a length of 2 cm were respectively removed by laser etching at both ends of the 2.0×2.0 cm area, to expose the glass substrate (that is, the effective ITO area at the bottom becomes 2×(2−0.35×2) cm2);

2) the etched ITO conductive glass was successively washed with water, acetone, and isopropanol by ultrasonic for several times until the glass surface was free from foreign matters and dirt, then the ITO conductive glass was dried with a nitrogen gun so as to dry the solvent, and was put into an ultraviolet ozone machine for further washing;

3) 2 mg/mL of a chlorobenzene solution of poly[bis(4-phenyl)(2,4,6-trimethylphenyl)amine] (PTAA) was spin-coated on the ITO conductive glass substrate after UV ozone treatment at a speed of 5000 rpm, on which annealing treatment was performed at 100° C. for 10 minutes, to obtain an organic hole transport layer with a thickness of about 20 nm;

4) a perovskite precursor solution (specific compositions were as follows: solvents were N,N-dimethylformamide and dimethyl sulfoxide, and a volume ratio of the two solvents was 4:1, and solid substance were lead iodide (1.0M, that is, 1.0 mol/L, the same below), lead bromide (0.2M), formamidine hydroiodide (0.95M), methylamine hydrobromide (0.19M), cesium iodide (0.06M)) was spin-coated on the film layer obtained in step 3) at a speed of 5000 rpm, on which annealing treatment was performed at 100° C. for 30 minutes, and then it was cooled to room temperature to obtain a perovskite layer with a thickness of about 600 nm, and the active substance of the obtained perovskite layer was $Cs_{0.05}(FA_{0.83}MA_{0.17})_{0.95}Pb(I_{0.83}Br_{0.17})_3$ (CsFAMA);

5) 20 mg/mL of a chlorobenzene solution of [6,6]-phenyl $C_{61}$ butyric acid methyl ester (PCBM) was spin-coated on the film layer obtained in step 4) at a speed of 1500 rpm, on which annealing treatment was performed at 100° C. for 10 minutes, where the resulting spin-coated thickness was about 60 nm, and then the passivation layer bathocuproine (BCP) was spin-coated at a speed of 5000 rpm with a spin-coated thickness of about 7 nm, to obtain an electron transport layer;

6) the film layer obtained in step 5) was placed into an evaporation coating machine, to evaporate an Ag metal electrode; and 7) the film layer obtained in step 6) was placed into a glove box (a mixture of an argon gas and a methylamine gas was in the glove box, where a volume ratio of the argon gas to the methylamine gas was 6:4, and an absolute pressure in the glove box was 3 standard atmospheres) for encapsulation, 0.5 mL of an ultraviolet curing adhesive (Norland ultraviolet curing optical adhesive NOA61) was applied on a surface of the cover glass with a size of 1.5×1.5×1.1 cm opposite to a surface of the ITO conductive glass containing the perovskite layer and peripheral edges thereof, thereby forming an enclosed space with a volume of about 0.1125 $cm^3$ between the ITO conductive glass and the cover glass.

By performing the foregoing steps, a perovskite solar cell in Example 1 may be obtained and was marked as Cell 1.

Example 2

Except that the volume ratio of the argon gas to the methylamine gas was adjusted to 7:3 in step 7), the other conditions of Example 2 were the same as those of Example 1, and the obtained cell was marked as Cell 2.

Example 3

Except that the volume ratio of the argon gas to the methylamine gas was adjusted to 8:2 in step 7), the other conditions of Example 3 were the same as those of Example 1, and the obtained cell was marked as Cell 3.

Example 4

Except that the volume ratio of the argon gas to the methylamine gas was adjusted to 9:1 in step 7), the other conditions of Example 4 were the same as those of Example 1, and the obtained cell was marked as Cell 4.

Comparative Example 1

Except that all of the mixture of the argon gas and the methylamine gas was replaced with argon in step 7) and methylamine gas was not introduced, the other conditions of Comparative Example 1 were the same as those of Example 1, and the obtained cell was marked as Cell 5.

Comparative Examples 2-3

Except that the volume ratio of the argon gas to the methylamine gas was respectively adjusted to 10:1 and 4:6 in step 7), the other conditions of Comparative Examples 2-3 were the same as those of Example 1, and the obtained cells were marked as Cell 6 and Cell 7.

Photoelectric Conversion Efficiency Test of Perovskite Solar Cell

Photoelectric Conversion Efficiency Test of Perovskite Solar Cell Before Encapsulation: test was carried out with Taiwan Entech I-V test system. The test was carried out in an AM 1.5G spectrum at a light intensity of 100 mW/cm$^2$ over a test range of −0.2-1.2V at a scan rate of 5 mV/s. A short circuit current (Jsc), an open circuit voltage (Voc), and a fill factor (FF) were read by the instrument and the photoelectric conversion efficiency was calculated according to the following formula: photoelectric conversion efficiency (PCE)=Jsc×Voc×FF.

Test Method and Data Processing Process After Encapsulation: after being encapsulated, the devices were stored under the conditions of 85° C. and 85% RH (relative humidity) for different days, and then were tested in the standard simulated sunlight (AM 1.5G, 100 mW/cm$^2$, a test range of −0.2-1.2V, a scan rate of 5 mV/s), and the photoelectric conversion efficiency of the devices was calculated according to the short-circuit current, the open circuit voltage and the fill factor given by software. A normalization process is performed, that is, the efficiency at day 0 was taken as 100% and the subsequent efficiency was divided by the efficiency at day 0, and the remaining proportion after the change was obtained. The normalized efficiency change curve can be obtained by plotting the obtained ratio against the number of storage days.

The situations of the short circuit current, the open circuit voltage, the fill factor and photoelectric conversion efficiency obtained by testing the solar cells obtained in Examples 1-4 and Comparative Examples 1-3 as time varies are shown in Tables 1 to 8 below.

TABLE 2

Test results in a case where volume ratio of argon to methylamine is 6:4

| Serial Number | Example 1 |
| --- | --- |
| Volume ratio of argon to methylamine | 6:4 |

Parameter test records after different storage time (days) after encapsulation

| Parameter (days) | Short circuit current (mA/cm$^2$) | Open circuit voltage (V) | Fill factor (%) | Photoelectric conversion efficiency (%) |
| --- | --- | --- | --- | --- |
| 0 | 23.87 | 1.09 | 80.59 | 20.97 |
| 5 | 22.70 | 1.10 | 80.62 | 20.13 |
| 10 | 23.01 | 1.07 | 80.04 | 19.71 |
| 15 | 23.02 | 1.07 | 80.00 | 19.71 |
| 20 | 22.77 | 1.06 | 79.92 | 19.29 |
| 25 | 22.53 | 1.06 | 79.89 | 19.08 |
| 30 | 23.09 | 1.05 | 79.56 | 19.29 |
| 35 | 23.22 | 1.04 | 79.02 | 19.08 |
| 40 | 23.36 | 1.05 | 78.63 | 19.29 |
| 45 | 23.63 | 1.03 | 77.53 | 18.87 |
| 50 | 23.21 | 1.04 | 76.43 | 18.45 |
| 55 | 23.80 | 1.02 | 76.86 | 18.66 |
| 60 | 23.52 | 1.01 | 75.91 | 18.03 |
| 65 | 23.85 | 1.03 | 75.10 | 18.45 |
| 70 | 23.33 | 1.03 | 75.90 | 18.24 |
| 75 | 23.65 | 1.03 | 74.02 | 18.03 |
| 80 | 23.41 | 1.02 | 75.50 | 18.03 |

TABLE 1

Summary of results of Examples and Comparative Examples

| Example | 1 | 2 | 3 | 4 | Comparative Example 1 | Comparative Example 2 | Comparative Example 3 |
| --- | --- | --- | --- | --- | --- | --- | --- |
| Volume ratio of argon to methylamine | 6/4 | 7/3 | 8/2 | 9/1 |  | 10/1 | 4/6 |

| Parameter | Normalized efficiency after different storage time (days) after encapsulation | | | | | | |
| --- | --- | --- | --- | --- | --- | --- | --- |
| (days) | (%) | (%) | (%) | (%) | (%) | (%) | (%) |
| 0 | 100 | 100 | 100 | 100 | 100 | 100 | 100 |
| 5 | 96 | 94 | 95 | 83 | 69 | 78 | 97 |
| 10 | 94 | 92 | 93 | 75 | 50 | 70 | 95 |
| 15 | 94 | 94 | 94 | 68 | 34 | 60 | 95 |
| 20 | 92 | 94 | 93 | 66 | 23 | 49 | 93 |
| 25 | 91 | 91 | 92 | 63 | 18 | 36 | 91 |
| 30 | 92 | 90 | 91 | 62 | 15 | 29 | 92 |
| 35 | 91 | 90 | 92 | 61 | 12 | 25 | 93 |
| 40 | 92 | 91 | 90 | 59 | 11 | 23 | 92 |
| 45 | 90 | 90 | 89 | 57 | 10.5 | 23 | 91 |
| 50 | 88 | 89 | 89 | 58 | 10.1 | 20 | 89 |
| 55 | 89 | 88.5 | 88 | 56 | 10 | 18 | 90 |
| 60 | 86 | 85 | 87 | 55 | 10.1 | 18 | 88 |
| 65 | 88 | 86 | 87 | 54 | 9.9 | 17 | 89 |
| 70 | 87 | 86 | 85 | 53 | 9.7 | 18 | 87 |
| 75 | 86 | 87 | 86 | 54 | 9.5 | 16 | 88 |
| 80 | 86 | 87 | 85 | 53 | 9.6 | 18 | 86 |

TABLE 3

Test results in a case where volume ratio of argon to methylamine is 7:3

| Serial number | Example 2 |
|---|---|
| Volume ratio of argon to methylamine | 7:3 |

Parameter test records after different storage time (days) after encapsulation

| Parameter (days) | Short circuit current (mA/cm$^2$) | Open circuit voltage (V) | Fill factor (%) | Photoelectric conversion efficiency (%) |
|---|---|---|---|---|
| 0 | 23.89 | 1.09 | 80.68 | 21.12 |
| 5 | 22.72 | 1.08 | 80.71 | 19.85 |
| 10 | 23.03 | 1.05 | 80.13 | 19.43 |
| 15 | 23.05 | 1.07 | 80.09 | 19.85 |
| 20 | 22.79 | 1.08 | 80.01 | 19.85 |
| 25 | 22.55 | 1.06 | 79.98 | 19.21 |
| 30 | 23.11 | 1.03 | 79.65 | 19.00 |
| 35 | 23.24 | 1.03 | 79.11 | 19.00 |
| 40 | 23.39 | 1.04 | 78.72 | 19.21 |
| 45 | 23.65 | 1.03 | 77.62 | 19.00 |
| 50 | 23.23 | 1.05 | 76.52 | 18.79 |
| 55 | 23.82 | 1.01 | 76.95 | 18.69 |
| 60 | 23.54 | 1.00 | 76.00 | 17.95 |
| 65 | 23.88 | 1.01 | 75.19 | 18.16 |
| 70 | 23.36 | 1.02 | 75.99 | 18.16 |
| 75 | 23.67 | 1.04 | 74.10 | 18.37 |
| 80 | 23.44 | 1.03 | 75.59 | 18.37 |

TABLE 4

Test results in a case where volume ratio of argon to methylamine is 8:2

| Serial number | Example 3 |
|---|---|
| Volume ratio of argon to methylamine | 8:2 |

Parameter test records after different storage time (days) after encapsulation

| Parameter (days) | Short circuit current (mA/cm$^2$) | Open circuit voltage (V) | Fill factor (%) | Photoelectric conversion efficiency (%) |
|---|---|---|---|---|
| 0 | 23.89 | 1.09 | 80.71 | 21.06 |
| 5 | 22.72 | 1.09 | 80.74 | 20.00 |
| 10 | 23.03 | 1.06 | 80.16 | 19.58 |
| 15 | 23.05 | 1.07 | 80.12 | 19.79 |
| 20 | 22.79 | 1.07 | 80.04 | 19.58 |
| 25 | 22.55 | 1.07 | 80.01 | 19.37 |
| 30 | 23.11 | 1.04 | 79.68 | 19.16 |
| 35 | 23.24 | 1.05 | 79.14 | 19.37 |
| 40 | 23.39 | 1.02 | 78.75 | 18.95 |
| 45 | 23.65 | 1.02 | 77.65 | 18.74 |
| 50 | 23.23 | 1.05 | 76.55 | 18.74 |
| 55 | 23.83 | 1.01 | 76.98 | 18.53 |
| 60 | 23.54 | 1.02 | 76.03 | 18.32 |
| 65 | 23.88 | 1.02 | 75.22 | 18.32 |
| 70 | 23.36 | 1.00 | 76.02 | 17.90 |
| 75 | 23.67 | 1.03 | 74.13 | 18.11 |
| 80 | 23.44 | 1.00 | 75.62 | 17.90 |

TABLE 5

Test results in a case where volume ratio of argon to methylamine is 9:1

| Serial number | Example 4 |
|---|---|
| Volume ratio of argon to methylamine | 9:1 |

Parameter test records after different storage time (days) after encapsulation

| Parameter (days) | Short circuit current (mA/cm$^2$) | Open circuit voltage (V) | Fill Factor (%) | Photoelectric conversion efficiency (%) |
|---|---|---|---|---|
| 0 | 23.87 | 1.09 | 80.662 | 21.03 |
| 5 | 19.98 | 1.09 | 80.092 | 17.45 |
| 10 | 18.79 | 1.06 | 79.11 | 15.77 |
| 15 | 17.08 | 1.07 | 78.07 | 14.30 |
| 20 | 16.57 | 1.07 | 77.99 | 13.87 |
| 25 | 16.03 | 1.07 | 76.96 | 13.24 |
| 30 | 16.35 | 1.04 | 76.63 | 13.03 |
| 35 | 16.00 | 1.05 | 76.09 | 12.82 |
| 40 | 15.92 | 1.02 | 75.70 | 12.40 |
| 45 | 15.53 | 1.02 | 75.59 | 11.98 |
| 50 | 15.53 | 1.05 | 74.49 | 12.19 |
| 55 | 15.76 | 1.01 | 73.92 | 11.77 |
| 60 | 15.48 | 1.02 | 72.97 | 11.56 |
| 65 | 15.42 | 1.02 | 72.16 | 11.35 |
| 70 | 15.36 | 1.00 | 71.96 | 11.14 |
| 75 | 15.48 | 1.03 | 71.08 | 11.35 |
| 80 | 15.63 | 1.00 | 70.56 | 11.14 |

TABLE 6

Test results of Comparative Example 1

| Serial number | Comparative example 1 |
|---|---|
| Volume ratio of argon to methylamine | / |

Parameter test records after different storage time (days) after encapsulation

| Parameter (days) | Short circuit current (mA/cm$^2$) | Open circuit voltage (V) | Fill factor (%) | Photoelectric conversion efficiency (%) |
|---|---|---|---|---|
| 0 | 22.93 | 1.09 | 80.37 | 20.13 |
| 5 | 15.90 | 1.09 | 80.10 | 13.88 |
| 10 | 11.99 | 1.06 | 79.12 | 10.06 |
| 15 | 8.17 | 1.07 | 78.08 | 6.844 |
| 20 | 5.60 | 1.07 | 77.00 | 4.62 |
| 25 | 4.44 | 1.07 | 75.97 | 3.62 |
| 30 | 3.88 | 1.04 | 74.64 | 3.01 |
| 35 | 3.09 | 1.05 | 74.10 | 2.41 |
| 40 | 2.91 | 1.02 | 73.71 | 2.21 |
| 45 | 2.85 | 1.02 | 72.61 | 2.11 |
| 50 | 2.66 | 1.05 | 72.51 | 2.03 |
| 55 | 2.76 | 1.01 | 71.94 | 2.01 |
| 60 | 2.79 | 1.02 | 70.99 | 2.03 |
| 65 | 2.78 | 1.01 | 70.18 | 1.99 |
| 70 | 2.80 | 1.00 | 68.98 | 1.95 |
| 75 | 2.72 | 1.03 | 68.10 | 1.91 |
| 80 | 2.83 | 1.00 | 67.58 | 1.93 |

TABLE 7

Test results in a case where volume ratio of argon to methylamine is 10:1

| Serial Number | Comparative example 2 | | | |
|---|---|---|---|---|
| Volume ratio of argon to methylamine | 10:1 | | | |
| Parameter test records after different storage time (days) after encapsulation | | | | |
| Parameter (days) | Short circuit current (mA/cm$^2$) | Open circuit voltage (V) | Fill factor (%) | Photoelectric conversion efficiency (%) |
| 0 | 22.90 | 1.09 | 80.06 | 20.03 |
| 5 | 19.87 | 1.09 | 71.97 | 15.62 |
| 10 | 16.96 | 1.06 | 77.79 | 14.02 |
| 15 | 15.14 | 1.07 | 73.99 | 12.02 |
| 20 | 13.57 | 1.07 | 67.41 | 9.81 |
| 25 | 11.42 | 1.07 | 58.88 | 7.21 |
| 30 | 10.86 | 1.04 | 51.31 | 5.80 |
| 35 | 10.07 | 1.05 | 47.25 | 5.00 |
| 40 | 9.89 | 1.02 | 45.56 | 4.60 |
| 45 | 9.83 | 1.02 | 45.84 | 4.60 |
| 50 | 8.64 | 1.05 | 44.04 | 4.00 |
| 55 | 6.74 | 1.01 | 52.78 | 3.60 |
| 60 | 5.78 | 1.02 | 61.01 | 3.60 |
| 65 | 4.77 | 1.03 | 69.12 | 3.40 |
| 70 | 4.69 | 1.03 | 74.43 | 3.60 |
| 75 | 4.71 | 1.03 | 65.88 | 3.20 |
| 80 | 4.72 | 1.03 | 73.96 | 3.60 |

TABLE 8

Test results in a case where volume ratio of argon to methylamine is 4:6

| Serial Number | Comparative Example 3 | | | |
|---|---|---|---|---|
| Volume ratio of argon to methylamine | 4:6 | | | |
| Parameter test records after different storage time (days) after encapsulation | | | | |
| Parameter (days) | Short circuit current (mA/cm$^2$) | Open circuit voltage (V) | Fill factor (%) | Photoelectric conversion efficiency (%) |
| 0 | 22.10 | 1.07 | 71.18 | 16.85 |
| 5 | 21.02 | 1.09 | 71.21 | 16.34 |
| 10 | 21.30 | 1.06 | 70.70 | 16.00 |
| 15 | 21.31 | 1.06 | 70.66 | 16.00 |
| 20 | 21.08 | 1.05 | 70.59 | 15.67 |
| 25 | 20.86 | 1.04 | 70.56 | 15.33 |
| 30 | 21.38 | 1.03 | 70.27 | 15.50 |
| 35 | 21.50 | 1.04 | 69.80 | 15.67 |
| 40 | 21.63 | 1.03 | 69.45 | 15.50 |
| 45 | 21.88 | 1.02 | 68.48 | 15.33 |
| 50 | 21.49 | 1.03 | 67.51 | 14.99 |
| 55 | 22.04 | 1.01 | 67.89 | 15.16 |
| 60 | 21.78 | 1.01 | 67.05 | 14.82 |
| 65 | 22.08 | 1.02 | 66.33 | 14.99 |
| 70 | 21.60 | 1.01 | 67.04 | 14.65 |
| 75 | 21.90 | 1.03 | 65.38 | 14.82 |
| 80 | 21.68 | 1.00 | 66.69 | 14.49 |

It can be seen from Table 1 to Table 8 in conjunction with FIG. 2 that, the stability of the perovskite solar cells encapsulated with a mixture of an inert gas and methylamine gas according to the present application was improved compared to a perovskite solar cell encapsulated with argon only. When the volume ratio of the gases was 10:1, the stability was not significantly improved compared with other ratios, and it was not much different from the blank. When the volume ratio of the gases was 4:6, the stability was improved significantly, but the initial efficiency of the device was significantly reduced. Meanwhile, when the volume ratio of argon to methylamine was increased from 9:1 to 5:5, the stability of the perovskite solar cell was accordingly further improved with no significant change in device efficiency, while as the volume ratio of argon to methylamine gas continued to increase, for example, when it was greater than 8:2, the stability of the cell did not change significantly.

It should be noted that the present application is not limited to the foregoing embodiments. The foregoing embodiments are merely examples, and embodiments having substantially the same constitution as the technical idea and exerting the same effects within the technical solution of the present application are all included within the technical scope of the present application. In addition, various modifications may be made to the embodiments by persons skilled in the art without departing from the spirit and scope of the present application, and other embodiments that are constructed by combining some of the constituent elements of the embodiments are also included in the scope of the present application.

What is claimed is:

1. A perovskite solar cell, comprising:
    following components provided successively from bottom to top:
        a transparent conductive glass substrate;
        a first transport layer;
        a perovskite layer;
        a second transport layer;
        a conductive electrode; and
        a back plate glass; and
    an encapsulating adhesive;
    wherein:
        the transparent conductive glass substrate, the back plate glass, and the encapsulating adhesive form an enclosed space;
        the enclosed space contains a mixture of an inert gas and a methylamine gas; and
        a volume ratio of the inert gas to the methylamine gas is in a range from 9:1 to 5:5.

2. The perovskite solar cell according to claim 1, wherein an absolute pressure within the enclosed space is 2-6 standard atmospheres.

3. The perovskite solar cell according to claim 1, wherein:
    an area of the perovskite layer is consistent with an area of the enclosed space, and a ratio of a thickness of the perovskite layer to a height of the enclosed space is 1/5000-1/500.

4. The perovskite solar cell according to claim 1, wherein the inert gas is selected from at least one of nitrogen and argon.

5. The perovskite solar cell according to claim 1, wherein the perovskite layer comprises a compound of formula $A^1BX_3$ or $A^2CDX_6$,
    $A^1$ is selected from at least one of $CH_3NH_3^+(MA^+)$ or $CH(NH_2)_2^+(FA^+)$;
    $A^2$ is selected from at least one of $Li^+$, $Na^+$, $K^+$, $Rb^+$, and $Cs^+$;
    B is selected from at least one of $Pb^{2+}$, $Sn^{2+}$, $Be^{2+}$, $Mg^{2+}$, $Ca^{2+}$, $Sr^{2+}$, $Ba^{2+}$, $Zn^{2+}$, $Ge^{2+}$, $Fe^{2+}$, $Co^{2+}$, and $Ni^{2+}$;
    X is selected from at least one of $F^-$, $Cl^-$, $Br^-$, and $I^-$; and
    C and D are independently selected from an organic or inorganic cation, or an organic-inorganic mixed cation.

6. The perovskite solar cell according to claim 1, wherein the perovskite layer comprises at least one of $CH_3NH_3PbI_3$, $CH(NH_2)_2PbI_3$, $Cs_{0.05}(FA_{0.83}MA_{0.17})_{0.95}Pb(I_{0.83}Br_{0.17})_3$, $CsPbI_3$, $CsPbI_2Br$, or $CsPbIBr_2$.

7. The perovskite solar cell according to claim 1, wherein:
the encapsulating adhesive is selected from one or more of an epoxy-based encapsulating adhesive, a silicone-based encapsulating adhesive, a polyurethane encapsulating adhesive, an ethylene-vinyl acetate copolymer, polyvinyl butyral, and a polyolefin-based encapsulating adhesive.

8. The perovskite solar cell according to claim 7, wherein the polyolefin-based encapsulating adhesive is selected from one or more of an ethylene octene copolymer and polyisobutylene.

9. The perovskite solar cell according to claim 1, wherein the encapsulating adhesive is selected from an ultraviolet light curing encapsulating adhesive.

10. The perovskite solar cell according to claim 1, wherein:
the transparent conductive glass substrate comprises one or more of fluorine-doped tin dioxide (FTO), indium-doped tin oxide (ITO), aluminium-doped zinc oxide (AZO), boron-doped zinc oxide (BZO), and indium-doped zinc oxide (IZO).

11. The perovskite solar cell according to claim 1, wherein:
one of the first transport layer and the second transport layer is an electron transport layer and another one of the first transport layer and the second transport layer is a hole transport layer.

12. The perovskite solar cell according to claim 11, wherein the electron transport layer comprises at least one of following materials, derivatives thereof, or materials obtained by doping or passivation thereof:
[6,6]-phenyl $C_{61}$ butyric acid methyl ester (PCiBM), [6,6]-phenyl $C_{71}$ butyric acid methyl ester ($PC_{71}BM$), fullerene C60 (C60), fullerene C70 (C70), tin dioxide ($SnO_2$), and zinc oxide (ZnO).

13. The perovskite solar cell according to claim 11, wherein the hole transport layer comprises at least one of following materials, their derivatives, or materials obtained by doping or passivation thereof:
poly[bis(4-phenyl)(2,4,6-trimethylphenyl)amine] (PTAA), poly-3-hexylthiophene (P3HT), triphenylamine with triptycene as a core (H101), 3,4-ethylenedioxythiophene-methoxytriphenylamine (EDOT-OMeTPA), N-(4-aniline)carbazole-spirobifluorene (CzPAF-SBF), poly(3,4-ethylenedioxythiophene): poly(styrene sulfonate) (PEDOT:PSS), polythiophene, nickel oxide ($NiO_x$), molybdenum oxide ($MoO_3$), cuprous iodide (CuI), cuprous oxide ($Cu_2O$).

14. The perovskite solar cell according to claim 1, wherein:
the conductive electrode comprises at least one of following materials: Ag, Cu, C, Au, Al, indium-doped tin oxide (ITO), aluminum-doped zinc oxide (AZO), boron-doped zinc oxide (BZO), and indium-doped zinc oxide (IZO).

15. The perovskite solar cell according to claim 1, wherein a thickness of the perovskite layer is in a range of 300-1000 nm.

16. A photovoltaic assembly comprising the perovskite solar cell according to claim 1.

17. An encapsulation method of a perovskite solar cell, comprising:
providing a perovskite solar cell assembly, comprising a transparent conductive glass substrate, a back plate glass, and a perovskite layer located between the transparent conductive glass substrate and the back plate glass; and
applying an encapsulating adhesive to form an enclosed space between the transparent conductive glass substrate and the back plate glass, the enclosed space containing a mixture of an inert gas and a methylamine gas with a volume ratio of in a range from 9:1 to 5:5.

* * * * *